(12) United States Patent
Sandberg

(10) Patent No.: US 7,736,710 B2
(45) Date of Patent: *Jun. 15, 2010

(54) PACKAGE AND METHOD OF CLOSING AND OPENING A PACKAGE

(75) Inventor: Lars Sandberg, Hammaro (SE)

(73) Assignee: Stora Enso AB, Karlstad (SE)

( * ) Notice: Subject to any disclaimer, the term of this patent is extended or adjusted under 35 U.S.C. 154(b) by 736 days.

This patent is subject to a terminal disclaimer.

(21) Appl. No.: 11/488,881

(22) Filed: Jul. 18, 2006

(65) Prior Publication Data

US 2007/0023382 A1  Feb. 1, 2007

Related U.S. Application Data

(60) Provisional application No. 60/704,307, filed on Aug. 1, 2005, provisional application No. 60/765,854, filed on Feb. 7, 2006.

(51) Int. Cl.
*B29C 63/00* (2006.01)
*B65D 51/00* (2006.01)

(52) U.S. Cl. .................. 428/34.1; 292/307 R; 220/200; 220/359.1; 220/359.3; 215/232; 156/60; 156/344; 156/584

(58) Field of Classification Search ............... 292/251.5, 292/261, 299, 314, DIG. 27, DIG. 42, DIG. 66; 220/200, 359.1, 201, 211, 230, 213, 305, 220/309.1, 328
See application file for complete search history.

(56) References Cited

U.S. PATENT DOCUMENTS

| | | | | |
|---|---|---|---|---|
| 1,198,227 A | * | 9/1916 | Hinchey | 292/251.5 |
| 1,553,146 A | * | 9/1925 | Dinsmoor | 292/307 R |
| 1,679,467 A | * | 8/1928 | Dinsmoor | 292/314 |
| 2,522,961 A | * | 9/1950 | Rabak | 220/201 |
| 2,744,655 A | | 5/1956 | Vnuk | |
| 3,129,817 A | | 4/1964 | Rohdin | |
| 3,348,640 A | * | 10/1967 | Thompson et al. | 188/250 G |
| 3,548,140 A | * | 12/1970 | O'Neill | 219/633 |
| 3,551,963 A | * | 1/1971 | Mosher | 24/618 |

(Continued)

FOREIGN PATENT DOCUMENTS

DE  1432090  12/1968

(Continued)

OTHER PUBLICATIONS

Linden, D.; Reddy, T.B. (2002). Handbook of Batteries (3rd Edition). McGraw-Hill.*

(Continued)

*Primary Examiner*—Rena L Dye
*Assistant Examiner*—Michele Jacobson
(74) *Attorney, Agent, or Firm*—Greer, Burns & Crain, Ltd.

(57) ABSTRACT

The disclosure relates to a package comprising a first portion and a second portion (or a first package member and a second package member) adapted to be connected to each other and thereby keep the package closed, wherein the first and second portions (or package members) are connected to each other by at least one adhesion area, wherein the adhesion area is adapted to comprise an electrically weakable adhesive. The disclosure further relates to a method of closing and opening a package.

25 Claims, 8 Drawing Sheets

U.S. PATENT DOCUMENTS

| | | | |
|---|---|---|---|
| 3,621,989 A | 11/1971 | Pregont | |
| 3,629,092 A | 12/1971 | George | |
| 3,679,534 A * | 7/1972 | Weinberg | 428/118 |
| 3,899,117 A * | 8/1975 | Peyser et al. | 229/5.5 |
| 3,916,756 A * | 11/1975 | Yoda | 24/682.1 |
| 3,968,823 A * | 7/1976 | Simon | 220/359.4 |
| 4,110,506 A | 8/1978 | Cottingham et al. | |
| 4,125,684 A * | 11/1978 | Land | 429/122 |
| 4,197,947 A | 4/1980 | Zaidi | |
| 4,333,569 A * | 6/1982 | Hammacher | 206/431 |
| 4,436,206 A | 3/1984 | Kuchenbecker | |
| 4,448,345 A | 5/1984 | Helms | |
| 4,525,233 A | 6/1985 | Brooks | |
| 4,539,275 A * | 9/1985 | Plasse | 429/152 |
| 4,586,624 A * | 5/1986 | Shaw | 220/613 |
| 4,599,273 A | 7/1986 | Eian et al. | |
| 4,669,610 A | 6/1987 | Lindsey et al. | |
| 4,721,543 A | 1/1988 | Wolfson | |
| 4,743,320 A * | 5/1988 | Shaw | 156/69 |
| 4,859,263 A * | 8/1989 | Dziurla et al. | 156/233 |
| 4,882,399 A * | 11/1989 | Tesoro et al. | 525/523 |
| 4,947,527 A * | 8/1990 | Hennig | 24/586.11 |
| 5,090,570 A | 2/1992 | Todd | |
| 5,100,494 A * | 3/1992 | Schmidt | 156/344 |
| 5,102,753 A * | 4/1992 | Rossoll et al. | 429/312 |
| 5,178,277 A | 1/1993 | Brown et al. | |
| 5,226,809 A * | 7/1993 | Franco | 24/704.1 |
| 5,244,092 A | 9/1993 | Karita et al. | |
| 5,252,413 A * | 10/1993 | Alamgir et al. | 429/316 |
| 5,289,785 A | 3/1994 | MacPherson et al. | |
| 5,412,918 A * | 5/1995 | Wendel et al. | 52/582.1 |
| 5,477,009 A * | 12/1995 | Brendecke et al. | 174/539 |
| 5,534,663 A * | 7/1996 | Rivers et al. | 174/363 |
| 5,582,884 A * | 12/1996 | Ball et al. | 428/341 |
| 5,656,081 A | 8/1997 | Isen et al. | 118/46 |
| 5,680,744 A * | 10/1997 | Kramedjian et al. | 53/447 |
| 5,763,058 A * | 6/1998 | Isen et al. | 428/209 |
| 5,976,955 A | 11/1999 | Hodges | |
| 6,050,622 A * | 4/2000 | Gustafson | 292/307 R |
| 6,098,800 A | 8/2000 | Bennish, Jr. et al. | |
| 6,116,501 A * | 9/2000 | Hupp | 229/125.09 |
| 6,336,567 B1 * | 1/2002 | Hyobu | 220/230 |
| 6,508,375 B1 * | 1/2003 | Krall | 220/359.1 |
| 6,620,308 B2 | 9/2003 | Gilbert | |
| 6,680,097 B1 | 1/2004 | Amberger et al. | |
| 6,838,617 B2 * | 1/2005 | Shaw et al. | 174/50 |
| 6,846,449 B2 * | 1/2005 | Martin et al. | 264/466 |
| 7,332,218 B1 * | 2/2008 | Gilbert | 428/343 |
| 7,465,492 B2 * | 12/2008 | Gilbert | 428/343 |
| 2001/0031367 A1* | 10/2001 | Gilbert | 428/447 |
| 2003/0217937 A1* | 11/2003 | Wilder et al. | 206/264 |
| 2004/0057638 A1 | 3/2004 | Perell et al. | |
| 2005/0109240 A1 | 5/2005 | Shen et al. | |
| 2005/0159184 A1 | 7/2005 | Kerner et al. | |
| 2005/0212304 A1* | 9/2005 | Herrera et al. | 292/251.5 |
| 2006/0027320 A1 | 2/2006 | Kueppers et al. | |
| 2008/0196828 A1* | 8/2008 | Gilbert | 156/274.8 |
| 2008/0283415 A1* | 11/2008 | Gilbert | 205/688 |

FOREIGN PATENT DOCUMENTS

| | | |
|---|---|---|
| DE | 3030290 | 4/1982 |
| DE | 3325383 | 3/1985 |
| EP | 0408900 | 1/1991 |
| GB | 2170470 | 8/1986 |
| WO | WO 9306992 | 4/1993 |
| WO | WO 2006050340 | 5/2006 |

OTHER PUBLICATIONS

Electronic Smart Packaging: Market Research Report; Published by: IDTechEx Ltd., Published Jul. 1, 2004, pp. 78-79.
Novel Adhesive Debonds Electrically; Dec. 2000, www.plasticstechnology.com.
International Search Report from PCT/SE2006/050261.
International Search Report from PCT/SE2006/050262.
International Search Report from PCT/SE2006/050263.
International Search Report from PCT/SE2006/050264.
International Search Report from PCT/SE2006/050265.
G.S. Shapoval, Cathodic initiation of Reactions of Macromolecule Formation and Degradation, Theoretical and Experimental Chemistry, vol. 30, No. 6, Nov. 1994.

* cited by examiner

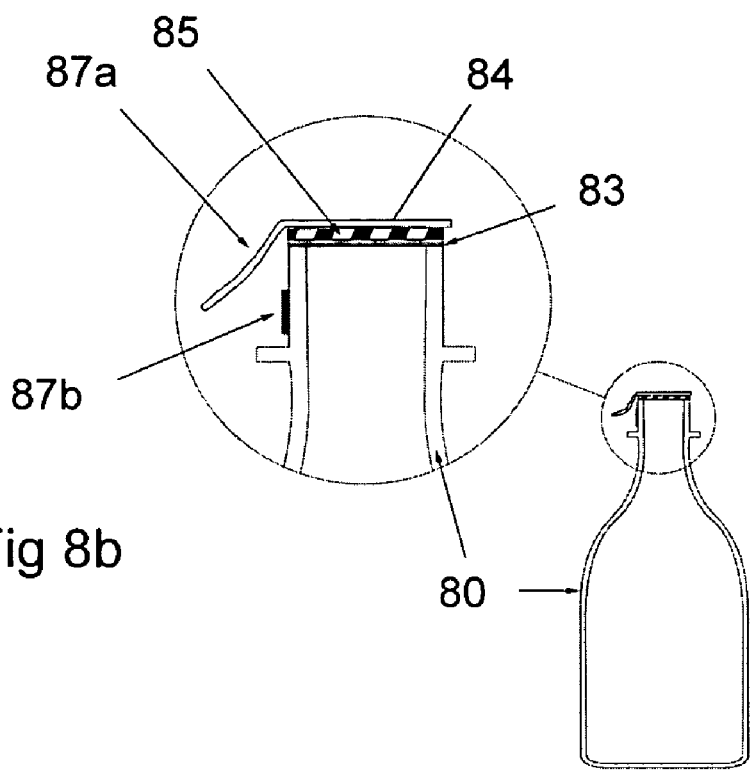
Fig 8b
Fig 8a
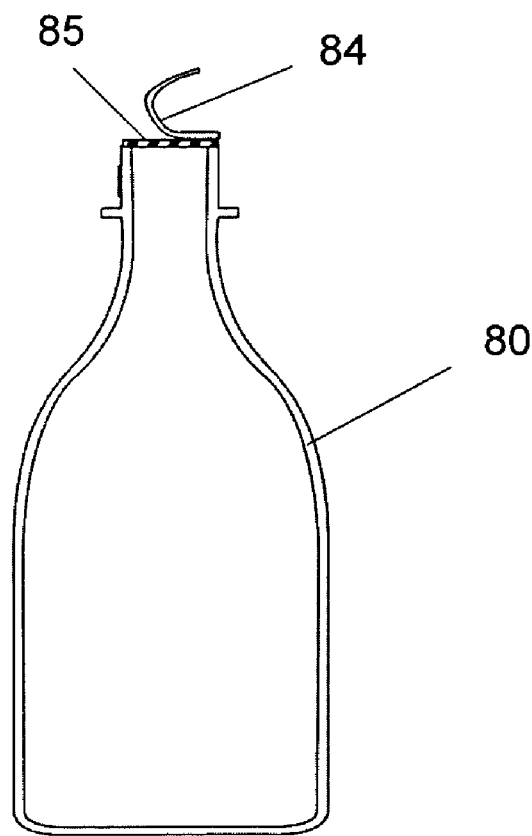
Fig 9

Fig 10a
Fig 10b
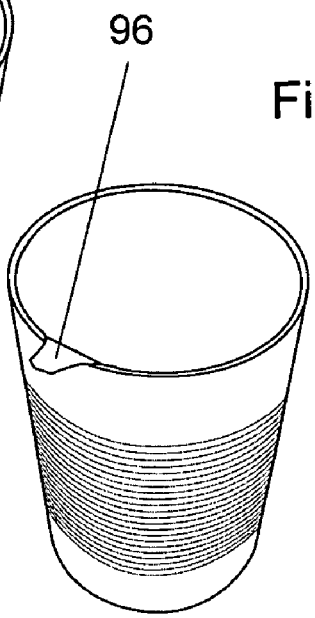
Fig 11
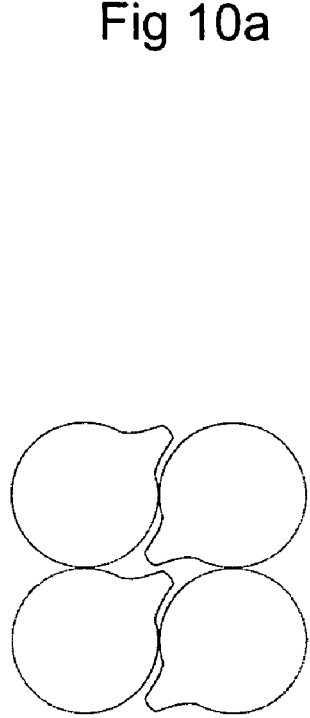
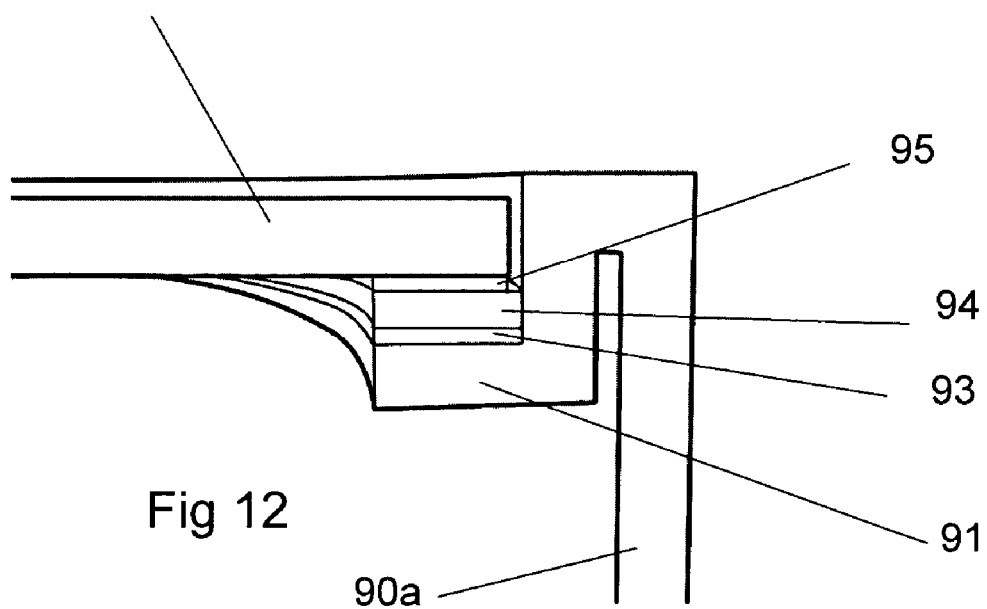
Fig 12

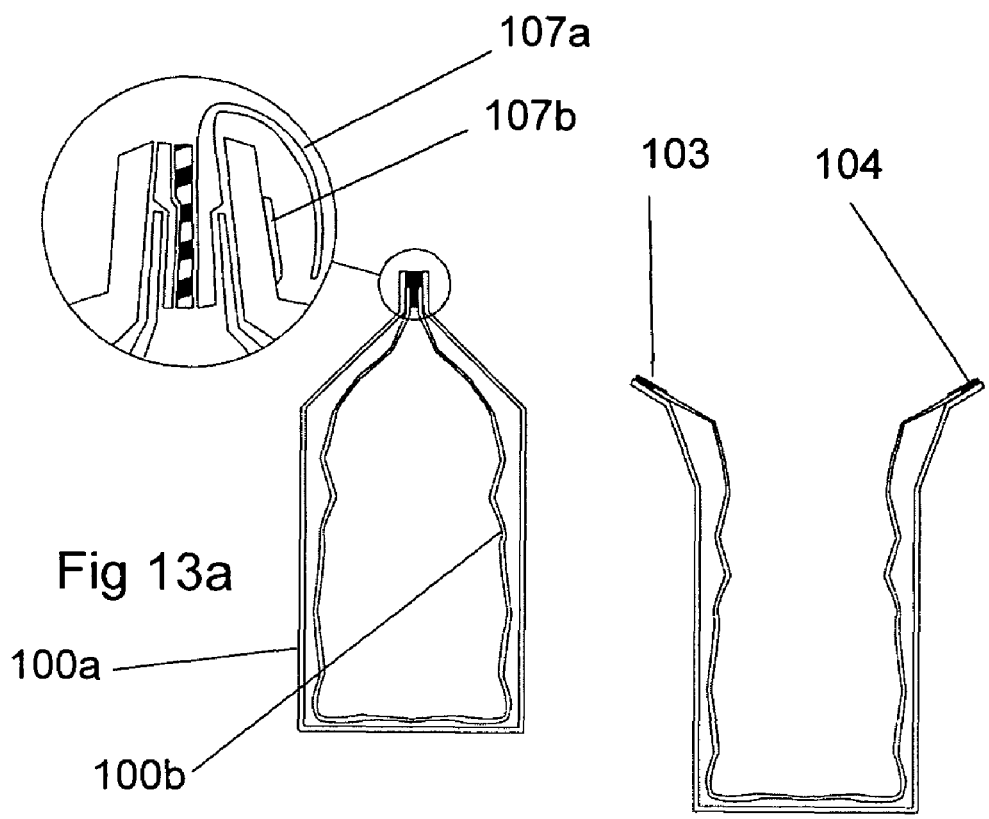
Fig 13a
Fig 13b
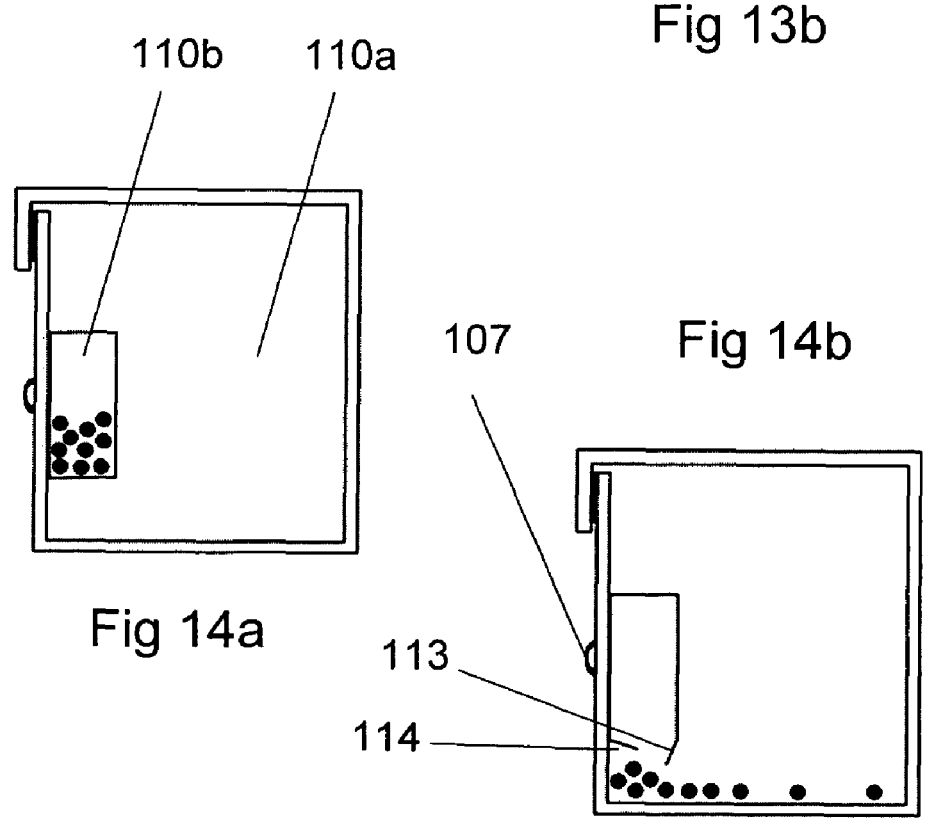
Fig 14a
Fig 14b

PACKAGE AND METHOD OF CLOSING AND OPENING A PACKAGE

CROSS REFERENCE TO RELATED APPLICATIONS

This Application claims priority from provisional application U.S. Ser. No. 60/704,307, filed on Aug. 1, 2005 and provisional application U.S. Ser. No. 60/765,854, filed on Feb. 7, 2006.

FIELD OF INVENTION

The invention relates to a package comprising a first portion and a second portion adapted to be connected to each other and thereby keep the package closed, wherein the first and second portions are connected to each other by at least one adhesion area.

The invention further relates to a package comprising a first package member adapted to co-operate with a second package member and thereby form a closed package, wherein the first package member is adapted to be connectable to the second package member by at least one adhesion area.

The invention further relates to a method of closing and subsequent opening of a package.

TECHNICAL BACKGROUND

The old way of distributing products in large distribution packages, followed by repacking of the products behind the store counter in paper bags, or the like, in the amount as bought by the consumer, has almost completely disappeared. Decades ago the wide spread of the large self service stores, with pre-packed products stored on shelves, from which the consumers themselves pick the products, lead to great developments in the packaging industry.

Today almost all consumer products are packed at the manufacturing or processing site, distributed, sold, and often also stored in the consumers' home, in one and the same package. One popular kind of package used for almost all kind of products is a box made of paperboard. Paperboard boxes are, e.g., widely used for dry food products and for small commodity items such as screws and nails. By providing an inner bag the paperboard box may also be used for liquids or for powder products, such as cocoa or dry milk. This kind of package is also widely used for cereals and similar products.

This kind of package is often adapted to be opened by first tearing off a tearing band or strip from the paperboard box and then cutting (with a pair of scissors) the inner bag open. The tearing band often extends across the complete top surface, from side edge to side edge, and separates a front flap connected with the front side of the container from a rear flap connected to the back side of the package. The front and rear flaps are often spot glued to side flaps folded from the sides of the package underneath the front and rear flaps. When the consumer opens such a package the tear band often breaks and the tearing action need to be restarted again. Moreover, the tear band often does not separate from the flaps as intended, which makes it more difficult to open the package and which often results in that any reclosing means, such as flaps and slits, are damaged.

Another kind of package often used as a consumer package is a bottle or jar formed of plastic or glass provided with a screw cap or snap lid formed of plastic or metal. This kind of package has an intrinsic problem relating to the compromise of providing a sufficiently low initial opening force and a sufficiently good sealing. Most caps or lids on this kind of package are fastened by threads or bayonet mount. In order to provide the necessary sealing pressure, the caps or lids must be fastened with a significant torque. Within the packaging industry there exist numerous variants concerning how to avoid the need for application of a high torque for closing the package. However, as will be discussed below, these variants introduce different drawbacks for the consumers when opening the packages, and especially at initial opening of the packages.

One kind of package often used for jam, pickled gherkin, and the like is a glass jar with a metal lid. Such a package is often filled by hot-filling or the like in order to create a negative pressure inside the jar. This negative pressure will force the lid against the mouth of the jar and will thereby improve the quality of the sealing between the lid and jar. However, this way of creating a good seal has the drawback that it is very hard to open such a jar; when trying to rotate the lid, the negative pressure will give rise to a high friction force counteracting the intended opening action. This kind of package also requires that the jar and lid are formed of relatively rigid components in order to be able to withstand the forces involved.

One kind of package often used for dry products, such as instant coffee, is a glass jar with a simple plastic lid. In order to provide sufficient sealing, the jar is, underneath the lid, provided with a sealing film or membrane. Such a sealing membrane is often also provided on plastic bottles for ketchup, mustard or the like, and boxes for table margarine or the like, where the lid has a snap functionality or some other functionality which is difficult to use to provide a sealing action. The film or membrane is often glued or fused to the mouth of the package. However, this kind of package suffers from the drawback that the necessary tearing off force must be sufficiently low so that the user is able to tear off the membrane and preferably in one piece, but the membrane should also be securely sealed to the mouth and it should from cost and environment aspects be as thin as possible. The result is often that the consumer has difficulties in tearing off the membrane at all or in tearing off the membrane in one piece. If the membrane is only partially torn off, it is often difficult to get rid of the remainders since any grip tab or the like has already been torn off.

Thus, the known packages all suffer from different drawbacks when it comes to opening of the packages.

It is well known in the art that polymer chains can be broken by the application of a voltage. This is for example discussed in a review article by G. S. Shapoval (Cathodic initiation of reactions of macromolecule formation and degradation, Theoretical and Experimental Chemistry, Volume 30, Number 6, November 1994).

U.S. Pat. No. 6,620,308 B2 discloses a material for use in the airplane industry. As is evident from the published patent, the material has been developed under the supervision of the U.S. Department of the Air Force. The material is developed for use as coatings and adhesives. It is further elaborated in U.S. Pat. No. 6,620,308 that the adhesive bonds and polymeric coatings are commonly used in the assembly and finishing of manufactured goods. It is stated that adhesive bonds are used in place of mechanical fasteners, such as screw, bolts and rivets, to provide bonds with reduced machining costs and greater adaptability in the manufacturing process. It is further discussed that adhesive bonds distribute stresses evenly, reduce the risk of fatigue, and seal the joints from corrosive species. It further asserts that, similarly, polymer-based coatings are commonly applied to the exterior surface of the manufactured products. These coatings provide protective layers that seal the surface from corrosive reactants, as well as provide a painted surface that can the aesthetically pleasing.

The composition disclosed in U.S. Pat. No. 6,620,308 B2 has a matrix functionality and an electrolyte functionality, wherein the electrolyte functionality is provided by a block copolymer or a graft copolymer. The matrix functionality provides an adhesive bond to a substrate, and the electrolyte functionality provides sufficient ionic conductivity to the composition to support a faradic reaction at an interface with an electrically conductive surface in contact with the composition, whereby the adhesive bond is weakened at the interface. The composition may be a phase-separated composition having first regions of substantially matrix functionality and second regions of substantially electrolyte functionality.

SUMMARY OF INVENTION

It is an object of the invention to provide a package which is not associated with the above mentioned problems or by which the above mentioned problems is at least reduced.

This object has been achieved by a package of the initially indicated kind which is characterised in that it comprises a first portion and a second portion adapted to be connected to each other and thereby keep the package closed, wherein the first and second portions are connected to each other by at least one adhesion area, wherein the adhesion area comprises an electrically weakable adhesive.

The above object has also been achieved by a package of the initially indicated kind which is characterised in that it comprises a first package member adapted to co-operate with a second package member and thereby form a closed package, wherein the first package member is adapted to be connectable to the second package member by at least one adhesion area, wherein the adhesion area comprises an electrically weakable adhesive.

By providing a package with a first and a second portion (or a first package member and a second package member) adhered to each other with an electrically weakable adhesive it is possible to provide packages which has hitherto not been possible to make. Furthermore, it is possible to provide packages of conventional design which are much easier to open compared to the packages of today.

The adhesion areas are provided with an electrically weakable adhesive that possesses adhesive properties and conductive properties. The package can further be provided with at least one active surface, being electrically conducting and in contact with the electrically weakable adhesive. When a voltage is applied between the active surfaces and current flows through a bonding layer comprising the electrically weakable adhesive, bonds formed in or between the bonding layer and at least one of the active surfaces are broken and/or weakened. Thus, the bonding layer forms an electrically weakable adhesive.

As mentioned above, glued cardboard packages are today often provided with a tear strip. With the new design of the package, there is no longer any need for such a tear strip. The package is glued together at filling of the package using an electrically weakable adhesive. When the consumer would like to open the package, a voltage is applied to the electrically weakable adhesive and the adhesive looses its adhesive force. The package is thereafter easily opened without any risk of being incorrectly torn open and without any risk of damaging any reclosure tabs/slots or the like. The package with the electrically weakable adhesive may also be designed or configured in a manner not possible today. When designing a conventional package, the designer must balance design requirements relating to erecting and closing of the container with design requirements relating to opening of the container. This often results in that the closing of the container is unnecessary complicated and still is hard to open the container as intended. This problem is eliminated or at least greatly reduced with the new package. It is e.g. possible to design the container in a way that gives a simple erecting and closing of the container by simply using adhesive connections where connection is desired. When the user wants to open the package a voltage is applied to the electrically weakable adhesive, and the desired connections are easily released. In this way it is further possible to design the package to be as strong as possible without the need for any far-reaching compromises concerning how to still make opening of the package easy. The package is in any case simply opened by the application of a voltage to the electrically weakable adhesive.

The package may also be provided as a semi-finished product comprising a first portion and a second portion adapted to be connected to each other and thereby keep the package closed, wherein the first and second portions are connected to each other by at least one adhesion area, wherein the adhesion areas comprises a first active surface, being electrically conducting and adapted to receive an electrically weakable adhesive, wherein the first active surface forms part of an electrical circuitry arranged to apply a voltage to said electrically weakable adhesive.

In this configuration the package is provided with the active surface whereas the electrically weakable adhesive is adapted to be applied to the active surface when the package is to be filled and closed. The advantages of the package have been discussed in detail above with reference to the embodiment of the package with the electrically weakable adhesive applied to the adhesion area.

Similarly, for a package with a body and a cap it is possible to provide a package which is tightly closed in distribution and which still is easily opened. The electrically weakable adhesive may, e.g., be used to secure a screw cap from unintentionally being screwed off the bottle and, after being subjected to a voltage, still easily release the cap from the bottle when the package is to be opened. This may also be used for a foil covered opening. The foil is securely fastened to the mouth of the bottle or jar using the electrically weakable adhesive. When the package is to be opened, a voltage is applied and the foil is easily removed. Thereby it is possible to even fasten the foil so securely that it is impossible to tear it off without applying a voltage. In any case it is possible to secure the foil to a greater extent than today and still make it possible to release it much easier than today. With this difference in securing power it is possible to design very thin foils, since they after application of a voltage only have to withstand any remaining tear-off resistance instead of as today where they during tear-off have to withstand the original tear-off resistance being designed to be high enough to keep the foil secured to the package during distribution.

Similarly, this package design may also be adapted to be provided as a semi-finished product comprising a first package member adapted to co-operate with a second package member and thereby form a closed package, wherein the first package member is adapted to be connectable to the second package member by at least one adhesion area, wherein the adhesion area comprise a first active surface, being electrically conducting and adapted to receive an electrically weakable adhesive, wherein the first active surface forms part of an electrical circuitry arranged to apply a voltage to said electrically weakable adhesive.

In this configuration the package is provided with the active surface whereas the electrically weakable adhesive is adapted to be applied to the active surface when the package is to be filled and closed. The advantages of the package has been discussed in detail above with reference to the embodiment of the package with the electrically weakable adhesive applied to the adhesion area.

The package may further comprise a second package member adapted to co-operate with the first package member and thereby form a closed package.

The use of electrically weakable adhesives also allows for the application of a tamper-proof feature integrally formed with the initial closure of the package. When the electrically weakable adhesive has reacted, it will no longer return to the same strong adhesive strength and it will thereby provide a tamper-proof feature.

The voltage applied may be either alternating or direct depending upon the desired manner of weakening of the electrically weakable adhesive. The voltage may, e.g., be applied by an external source, such as a battery, by electromagnetic waves, or by designing the package with active surfaces of different materials with different potentials, thereby forming an internal battery.

The package may further comprise a first and a second active surface being electrically conducting and being arranged at a distance from each other and being adapted to be electrically connectable to each other via an electrical circuit, wherein the electrically weakable adhesive is adapted to bridge the distance between the first and second active surfaces. In this way it is possible to in a controlled way apply a voltage across the electrically weakable adhesive. The two active surfaces are connectable to two different electrode potentials thereby causing a voltage across the electrically weakable adhesive. As mentioned above, the voltage may be provided in a number of ways.

The electrically weakable adhesive may form a sealing layer. In this way it is possible to form a securely sealed package which still may be easily opened.

The package may be formed of a non-conductive material. In this way the conductors, such as the active surfaces, may simply be provided as printed or laminated conductors on the non-conductive material. There will be no immediate need for more complicated laminate structures with insulating layers, etc.

The package may be formed of paper board or of plastic. Either of these materials is preferred since it is easy to provide a connecting element or a package in paper board or in plastic. Plastic or paper board are also normally non-conducting making it easy to provide it with an electrical circuitry using, e.g., a printing or laminating technique.

The package may comprise an internal source of electrical power adapted to be activated or connected to the conductors to in a closed electrical circuit apply voltage to respective adhesion areas. In this way the package may be opened anywhere and by anyone.

The first active surface may be of a first material with a first electrode potential, and the second active surface may be of a second material with a second electrode potential, and wherein the first electrode potential differs from the second electrode potential. In this way the active surfaces as such will act as an internal source of electrical power and will when connected to each other via an electrical circuitry outside the electrically weakable adhesive form a closed electrical circuit applying a voltage across the electrically weakable adhesive.

The connecting element or package may further comprise at least one printed and/or laminated battery. This is an expedient way of providing an internal source of electrical power.

The at least one printed and/or laminated battery may be printed on a first carrier layer. This is an expedient way of providing a battery forming an internal source of power. As indicated the first carrier layer may also be used to carry one or more active surfaces. Thereby it is easy to provide a connection between the battery and the one or more active surfaces on the first carrier layer.

The package may further comprise a first carrier layer with a first surface, the first and second active surfaces being supported by the carrier layer, wherein the first active surface is separated from the second active surface a first distance along the surface of the first carrier layer, wherein the laminate structure is adapted to receive an electrically weakable adhesive bridging said distance between the active surfaces.

In this way it is possible to pre-manufacture parts of the structure with the active surfaces on a single carrier layer. When the package is to be closed, the electrically weakable adhesive is applied to the active surfaces and a second carrier layer is put onto the adhesive, whereby the first and second portions (or first and second members) of the package are connected to each other. This design also makes it possible to provide both active surfaces on one and the same side of the layer of the electrically weakable adhesive, and thereby on one and the same portion or package member. Such a design facilitates the provision of any circuitry, since the circuitry in such a case does not have to bridge any interface between the first and second portions (or first and second package members).

The first active surface may be separated from the second active surface a distance in a direction of a normal to the first active surface, wherein an electrically weakable adhesive may be bridging the distance between the first and second active surfaces. One advantage with such a design is that it is relatively easy to provide a large contact interface between the electrically weakable adhesive and the active surfaces. Moreover, the distance bridged by the electrically weakable adhesive can be kept the same over a large interface, which will give a controlled disbanding.

This design may, e.g., also be used where the voltage is applied by an external voltage. The first active surface is provided with a first connector portion and the second active surface is provided with a second connector portion, whereby an external voltage source is connected to the connector portions and a voltage is applied across the electrically weakable adhesive.

The first portion or the first package member may form the first carrier layer. The first package member may form a container body, such as a bottle or a jar, and the second package member may form a closure member, such as a cap. However, in an alternative the first package member forms a closure member and the second package member forms a container body. The exact choice of which part of the package that forms the first and the second portion (or member) depends amongst others on the materials chosen for the different parts. If the container body is made of paper it is often the available area that determines where the active surfaces are arranged. If the container body is made of glass and the cap is made of plastic, it may be convenient to provide the cap with the necessary circuitry and to leave the container body essentially unchanged compared to a conventional glass bottle with plastic cap. If the bottle is made of plastic it may be convenient to provide the bottle neck with the necessary circuitry. A screw cap is usually rather well aligned with the bottle neck which opens for the possibility to provide the bottle neck with some parts and the cap with other parts of the circuitry.

A portion of at least one of said active surfaces may be exposed and adapted to be covered by said adhesive. In this way the electrically weakable adhesive will in itself provide the conductive bridge to this active surface.

At least a portion of the first active surface and at least a portion of the second active surface are exposed and adapted to be covered by said adhesive. In this way the electrically weakable adhesive will in itself provide the conductive bridge to both active surfaces.

The active surfaces may be shaped such that a projection of the first active surface on the surface of the carrier layer essentially surrounds a projection of the second active surface on the surface of the carrier layer. In this way the area in which the electrically weakable adhesive will be broken or weakened will be relatively large compared to the size of the active surfaces. In this way the energy losses due to resistance in the active surfaces will be minimized. It will furthermore provide a rather concentrated weakening of the adhesive, which will facilitate the opening of the package.

A projection of the first active surface on the first surface and a projection of the second active surface on the first surface may at least partly overlap each other, wherein the laminate structure further comprises an insulating layer provided between the first and second active surfaces at least at the overlap. By providing active surfaces with overlaps and insulating layers there between it is possible to optimise the shape of the electrically weakened area, without having to be limited by separation in the plane of the carrier layer.

The first active surface may be formed as a closed loop with its projection on the surface of the first carrier layer surrounding the projection of the second active surface on the surface of the first carrier layer, wherein the second active surface has a connecting portion extending out of the closed loop of the first active surface, and wherein the electrically insulating layer separates the connecting portion from the first active surface. In this way the electrical potential will be bridged by the electrically weakable adhesive to the first active surface all the way around the second active surface. This will give a relatively large weakened area compared to the size of the second active surface.

The package may further comprise an electrically weakable adhesive bridging said distance between the active surfaces, and adapted to be located between the active surfaces and a second carrier layer. It may, e.g., be noted that packages may be sold to a food producer with active surfaces provided on the packages but without any electrically weakable adhesive thereon. The electrically weakable adhesive may then be applied when the package is to be closed.

The package may further comprise a non electrically weakable adhesive arranged as a layer adapted to be located between the electrically weakable adhesive and a second carrier layer. In this way it is possible to pre-manufacture the structure with active surfaces and electrically weakable adhesive and then to apply a conventional adhesive on top of this when the package is closed for the first time. When the package is to be opened the electrically weakable adhesive is weakened and the conventional adhesive will be released together with the portion or package member not carrying the active surfaces. It is also contemplated to provide two layers of electrically weakable adhesive, one layer in the pre-manufacturing step and a second layer when the package is closed.

The package may further comprise a second carrier layer adhered to the first carrier layer and the active surfaces by said electrically weakable adhesive or said non electrically weakable adhesive.

The invention may also be said to involve a method comprising; providing a package body comprising a first portion and a second portion adapted to be connected to each other by at least one adhesion area and thereby keep the package closed, applying an electrically weakable adhesive to the at least one adhesion area and connecting the first and second portions to each other in the at least one adhesion area and thereby closing the package. In this way a package provided with, e.g., flap portions or an integrated lid is conveniently closed.

The invention may also be said to involve a method comprising; providing a first package member and a second package member adapted to be connected to each other by at least one adhesion area and thereby form a closed package, applying an electrically weakable adhesive to the at least one adhesion area and connecting the first package member to the second package member in the at least one adhesion area and thereby closing the package. In this way, a package formed of two or more separate package members, such as a bottle and a cap or a jar and a lid, is conveniently closed.

In one embodiment, the first and the second portions of the package or the first package member and the second package member are connected to each other with the electrically weakable adhesive. In this way, no extra adhesive is needed to close the package.

In another embodiment, the first and the second portions of the package or the first package member and the second package member are connected to each other with a second adhesive that do not have to be electrically weakable. In this way, it is possible to pre-manufacture parts of the structure.

The methods may further comprise applying a voltage across the electrically weakable adhesive. In this way, the bond of the electrically weakable adhesive is weakened or broken as discussed in detail above.

The method may further comprise the opening of the package by separating the first package portion or member from the second package portion or member. In this way, the weakened bond of the electrically weakable adhesive is broken and the package is easily opened.

BRIEF DESCRIPTION OF THE DRAWINGS

The invention will by way of example be described in more detail with reference to the appended schematic drawings, which shows a presently preferred embodiment of the invention.

FIG. 8*a* shows a bottle provided with a sealing foil.

FIG. 8*b* shows in enlargement a portion of the bottle of FIG. 8*a*.

FIG. 9 shows the bottle of FIG. 8*a* with the foil partly removed.

FIG. 10*a-b* show a can with a lid.

FIG. 11 shows a number of cans arranged side by side.

FIG. 12 is a cross-section showing the connection between the lid and the can body.

FIG. 13a-b shows a bag-in-box package.

FIG. 14a-b shows a package provided with a secondary compartment for a secondary product.

DETAILED DESCRIPTION OF PREFERRED EMBODIMENTS

Figure 1A:
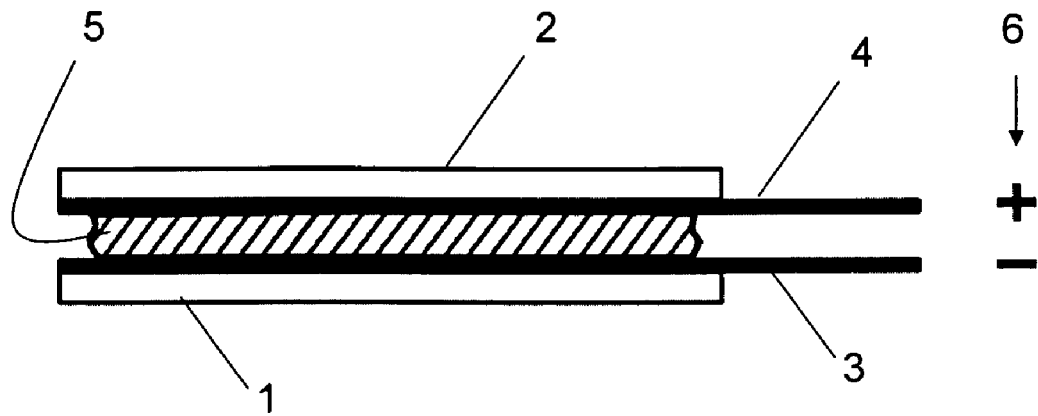
FIG. 1*a-c* shows a first basic structure in which different layers are connected to each other using an electrically weakable adhesive, wherein the three figures indicate three different alternatives of how an electrical energy may be applied in order to weaken the adhesive.

The packages described in the following make use of an electrically weakable adhesive material. The inventive packages are provided with two active surfaces acting as electron and/or ion emitter and receiver connected with a bonding layer formed by the electrically weakable adhesive material. The bonding layer possesses adhesive properties and conductive properties. When a voltage is applied between the active surfaces and current flows through the bonding layer, bonds formed in or between the bonding layer and at least one of the active surfaces are broken or weakened. Thus, the bonding layer forms an electrically weakable adhesive.

The electrically weakable adhesive may bridge the complete distance between the active layers but may also be completed with additional layers of other materials capable of performing the necessary electrical and/or mechanical connection. Such materials may be conventional non electrically conductive adhesives, polymers, varnishes, or the like, or electrically conductive versions of respective material.

The electrically weakable material and different basic configurations of the active surfaces will initially be discussed in detail separately from the specific designs of the packages. The different designs of the packages will thereafter be discussed in detail. In some cases the design of the package will be discussed in combination with a specific kind of basic configuration. It should however be noted that this is for exemplifying purposes and that the different basic configurations may be combined with the different designs of the packages.

According to one embodiment the bonding layer is composed of a composition possessing both matrix functionality and electrolyte functionality. The matrix and the electrolyte functionalities may be formed by a single phase or several separate phases.

The matrix functionality provides the adhesive properties necessary to bind surfaces to each another mechanically or chemically. The matrix functionality may be provided by polymers, polymer resins or fibres that possess adhesive properties.

The electrolyte functionality provides the ion conductivity necessary to support a faradic reaction, i.e. an electrochemical reaction in which a material is oxidized or reduced, or some other chemical/physical reaction. The materials are preferably chosen and designed in such a way that the reaction occurs at the interface between one or both of the active surfaces and the bonding layer. Alternatively the bonding layer may be designed such that the reaction will occur within the bonding layer. This may, e.g., be accomplished by providing islands of a material with electrolyte functionality within the matrix material. The electrolyte functionality may be provided by adding a salt to the material or by modifying the polymer so that it includes ion-coordinating moieties.

The electrically weakable adhesive used in the inventive packages may be the electrochemically disbondable composition ElectRelease™ supplied by EIC laboratories and disclosed in more detail in U.S. Pat. No. 6,620,308.

Figure 1B:
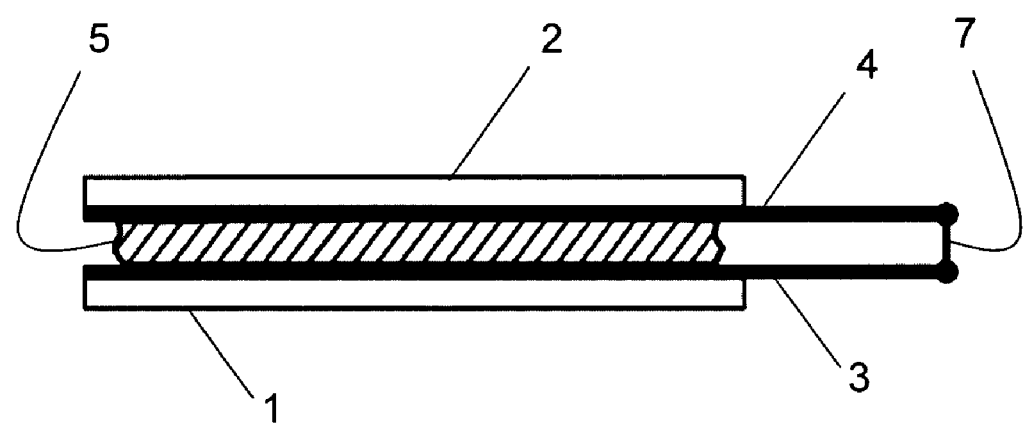
Figure 1C:
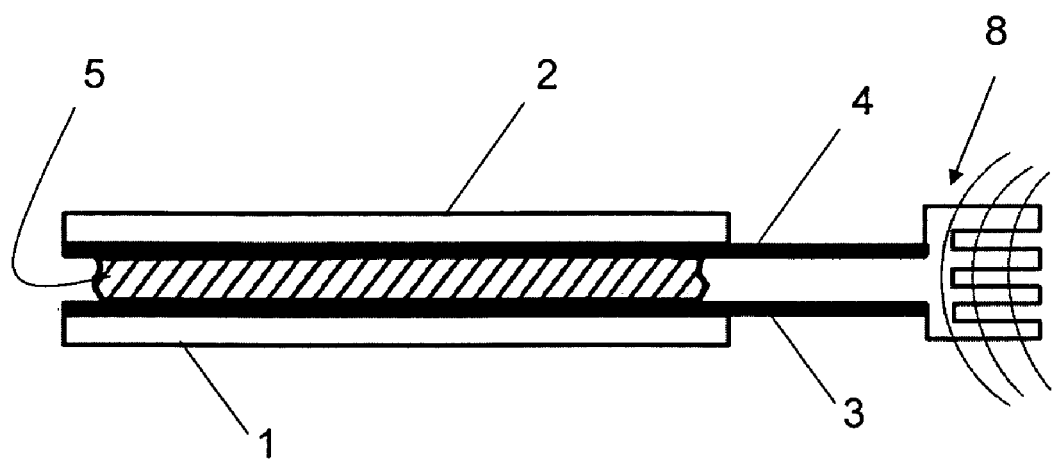

FIG. 1a-1c shows a common basic structure with three different alternatives of how to apply the electrical energy to break or weaken the bond of the bonding layer.

The basic structure comprises a first carrier layer 1 and a second carrier layer 2. A first active layer 3 is laminated on the first carrier layer 1. A second active layer 4 is laminated on the second carrier layer 2. The active layers are bonded together by a bonding layer 5, comprising an electrically weakable adhesive.

In FIG. 1a, the electrical potential difference between the active layers 3, 4 is adapted to be provided by an external source 6 of electrical energy (indicated by the + and − signs). This external source may, e.g., be a battery provided in a handheld device, or a battery being attached to the package and connectable to the active layers 3, 4. One or several batteries can, e.g., be printed on one of the carrier layer and connected to the active surfaces. In this design the two active layers 3, 4 may, but need not, be formed of the same material. When a voltage is applied between the active surfaces 3, 4, current will flow between the active surfaces 3, 4 via the bonding layer 5. This will cause the bonds in the bonding layer 5 or between the bonding layer 5 and one or both of the active surfaces 3, 4 to break or to weaken. The current applied may be in the form of direct current or alternating current. A direct current is preferably used to weaken the bonds in the bonding layer 5 or between one of the active surfaces 3 or 4 and the bonding layer 5. An alternating current is preferably used to weaken the bonds in the bonding layer 5 or between both of the active layers 3, 4 and the bonding layer 5.

In FIG. 1b, the electrical potential difference between the active layers 3, 4 is adapted to be provided by making the active layers 3, 4 of different materials with different electrode potentials. If the two active layers 3, 4 are connected, e.g. by moving a switch 7 to a position where it connects the two layers 3, 4, a closed circuit is formed and current will flow through the bonding layer 5, thereby causing the adhesive bond to break or weaken. For example, copper and graphite can be used as active layers 3, 4 with different potentials. This design will create a flow of direct current between the active layers 3, 4 via the bonding layer 5.

In FIG. 1c, the electrical potential difference between the active layers 3, 4 is provided by supplying electro magnetic waves, e.g. radio waves, to the package. The active layers 3, 4 or a separate member 8 connected to the active layers 3, 4 may be adapted to be subjected to the electro magnetic waves and transform this wave to an electrical potential difference between the active layers 3, 4. The AC voltage generated by the electro magnetic waves can be used directly or transformed to DC voltage by a rectifier, e.g. a half-wave rectifier or a full-wave rectifier, connected to the active surfaces. The member 8 may e.g. be an antenna or coil. In this design the two active layers 3, 4 may, but need not, be formed of the same material.

Figure 2:
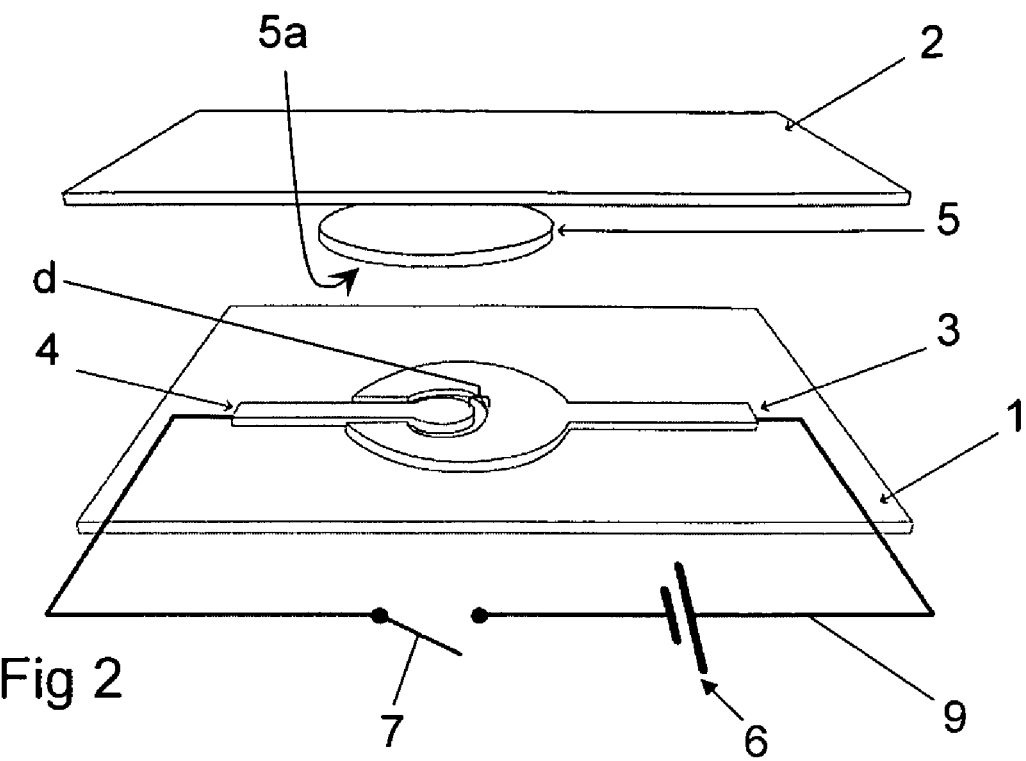
FIG. 2 shows in an exploded view a first embodiment of a second basic structure with the active surfaces arranged on the same side of the adhesive layer.
Figure 3:
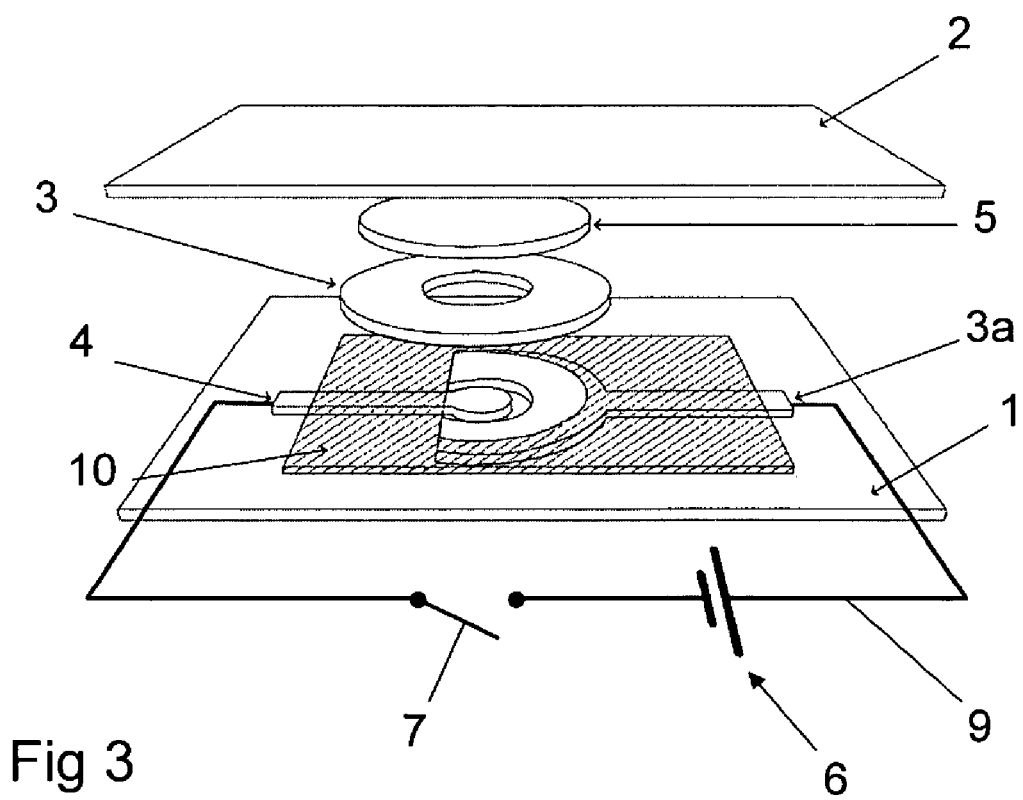
FIG. 3 shows in an exploded view a second embodiment of the second basic structure.
Figure 4:
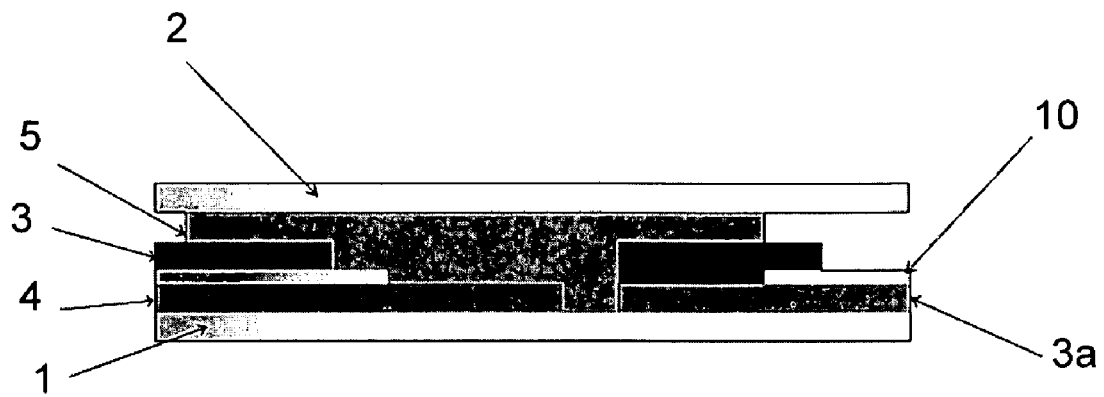
FIG. 4 shows a cross-section of the structure in FIG. 3.
Figure 5:
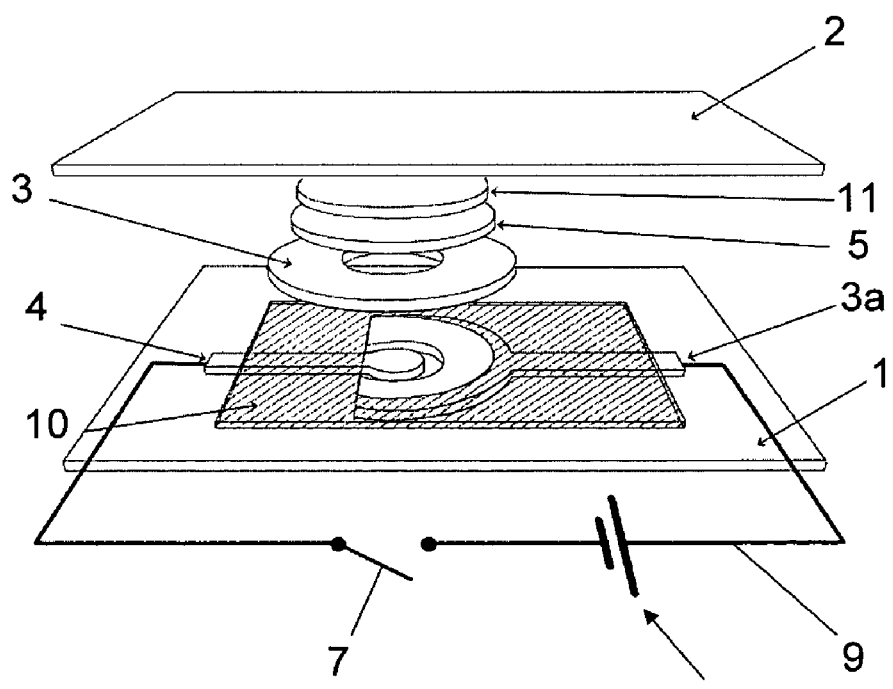
FIG. 5 shows in an exploded view of a third embodiment of the second basic structure.

FIG. 2-5 show embodiments wherein the active surfaces are arranged on the same side on a carrier layer. In FIGS. 2, 3 and 5, the different layers are for clarity reasons illustrated at a distance from each other. However, it is apparent that in practice the layers forms a laminated structure. From the description below it will follow in which cases the different disclosed layers need to be in direct contact with each other and when there may be one or more additional, non-disclosed layers between the disclosed layers. It may also be noted that in direct contact may dependent upon the situation mean in mechanical contact or in electrical contact. Furthermore, the teachings concerning different ways of applying the voltage discussed in FIG. 1a-c are applicable also for the embodiments of FIG. 2-5.

FIG. 2 shows an embodiment wherein the active surfaces 3, 4 are arranged on the same side of the bonding layer, instead of being provided as two separate layers 3, 4 on either side of the bonding layer 5 as in FIG. 1a-c. The structure comprises two carrier layers 1, 2 that are to be delaminated. The carrier layers 1, 2 may, e.g., be made of paper, paper board or plastic, but other materials are contemplated. The active surfaces 3, 4 are arranged on one side of the bonding layer 5 and are separated from each other a distance d along the surface 5a of the carrier layer 1.

The active surfaces 3, 4 may be applied to the first carrier layer 1 using any conventional method, they may e.g. be printed or laminated onto the carrier layer 1. The active surfaces 3, 4 may be made of any conductive material, e.g. metal ink or foil. The bonding layer 5 is provided between respective active surface 3, 4 and the second carrier layer 2, thereby bonding the active surfaces 3, 4 to the second carrier layer 2 and in turn thereby bonding the two carrier layers 1, 2 to each other. The bonding layer 5 typically reaches the first carrier layer 1 in the small accessible area formed by the gap or distance d between the active surfaces 3, 4. As shown in FIG. 2, one of the active surfaces 3 has an area of distribution formed as an open half-circle partially enclosing the other active surface 4. This other active surface 4 has an area of distribution formed as a circle. The two active surfaces 3, 4 form a gap formed as a part of a ring, in this case a part of a circular ring, having a width defined by the above mentioned distance d.

The active surfaces 3, 4 are also connected or connectable to each other via a circuit 9 comprising an external power supply 6 and a switch 7.

When a voltage is applied between the active surfaces 3, 4, e.g. by the closure of the switch 7, current will flow between the active surfaces 3, 4 via the bonding layer 5. This will cause the bonds in the bonding layer 5 or between the bonding layer 5 and one or both of the active surfaces 3, 4 to break or to weaken. The accessible area of the first carrier layer 1 between the active surfaces 3, 4 may be made so small that even if the bonding layer 5 reaches the first carrier layer 1, the force needed to break the bond between this accessible area and the bonding layer 5 is negligible.

The power supply 6 can, e.g., be at least one battery that is printed or laminated on the carrier layer 1 and connected to the active surfaces 3, 4. In this way, the battery 6 and the active surfaces 3, 4 can be printed or laminated on the carrier layer in the same process step. In order to increase the power supply, several batteries can be printed on the carrier layer 1 and connected to the active surfaces. This enables all batteries and the active surfaces to be printed on the carrier layer in the same process step, which facilities the manufacturing of the structure.

In an alternative embodiment to the one shown in FIG. 2, the active surfaces 3, 4 are formed of different materials with different potentials. In such an embodiment the external power supply 6 may be dispensed with. When the circuit 9 is closed by the switch 7, current will flow between the active surfaces 3, 4 via the bonding layer 5, which will cause the bonds in the bonding layer 5 or between the bonding layer 5 and one or both of the active surfaces 3, 4 to break or to weaken.

FIGS. 3 and 4 shows yet another embodiment of a kind similar to the one shown in FIG. 2. In the embodiment of FIGS. 3 and 4, the active surfaces 3, 4 are separated out of the plane by an insulating layer 10, but are still on the same side of the bonding layer 5 compared to the second carrier layer 2. The first active surface 3 is electrically connected to a connector 3a that formed part of the first active surface 3 in the embodiment of FIG. 2.

The insulating layer 10 separates the conducting elements and protects them from tear and wear. The connector 3a is in contact with the first active surface 3, but there is no direct connection between the connector 3a and the second active surface 4.

The second active surface 4 is provided on the carrier layer 1 as in the embodiment of FIG. 2. The insulating layer 10 is provided on this structure. Above the insulating layer 10 is the first active surface 3 arranged, and finally on top of this is the bonding layer 5 arranged. Since the first and second active surfaces 3, 4 are separated out of the plane, the first active surface 3 may be formed as a circular member completely surrounding the circular end portion of the second active surface 4. The active surfaces 3, 4 and the insulating layer 10 provides a gap between the active surfaces 3, 4 adapted to be bridged by the bonding layer 5. The bonding layer 5 may extend all the way from the second carrier layer 2 to the first carrier layer 1 and thereby provide a direct adhesion between the first and second carrier layer 1, 3.

The active surfaces 3, 4 are also connected or connectable to each other via a circuit 9 comprising an external power supply 6 and a switch 7.

When a voltage is applied between the active surfaces 3, 4, e.g. by the closure of the switch 7, current will flow between the active surfaces 3, 4 via the bonding layer 5. This will cause the bonds in the bonding layer 5 or between the bonding layer 5 and one or both of the active surfaces 3, 4 to break or to weaken. The accessible area of the first carrier layer 1 between the active surfaces 3, 4 may be made so small that even if the bonding layer 5 reaches the first carrier layer 1, the force needed to break the bond between this accessible area and the bonding layer 5 is negligible.

In an alternative embodiment to the one shown in FIGS. 3 and 4, the active surfaces 3, 4 are formed of different materials with different potentials. In such an embodiment the external power supply 6 may be dispensed with. When the circuit 9 is closed by the switch 7, current will flow between the active surfaces 3, 4 via the bonding layer 5, which will cause the bonds in the bonding layer 5 or between the bonding layer 5 and one or both of the active surfaces 3, 4 to break or to weaken.

FIG. 5 shows an alternative embodiment to the one shown in FIGS. 3 and 4, wherein the bonding layer 5 is adapted to carry a second bonding layer 11. This second bonding layer 11 may be formed of an adhesive that do not have to be conductive or electrically weakable. By providing this second bonding layer it is possible to pre-manufacture the first carrier layer 1 with the active surfaces 3, 4 and the bonding layer 5, and then finally apply a second bonding layer 11 on the electrically weakable bonding layer 5 when the second carrier layer 2 is to be fastened to the first carrier layer 1. This additional bonding layer 11 may also be used in the design disclosed in FIG. 2.

An artisan will realise that there exists several alternatives to and combinations of the above disclosed embodiments. A brief discussion of some these alternatives follow hereinafter.

Respective active surface/layer may be arranged directly or indirectly via a laminating layer or the like on respective carrier layers. The active layer may in it self form both active surface and carrier layer.

As mentioned above the active surfaces may be separated in the plane and/or out of the plane. In order to separate the active surfaces out of the plane, an insulating layer, e.g. varnish, may be used. Insulating layers may also be used to separate conductive elements, such as active surfaces, from the carrier layer in cases when the carrier layer is conductive. Additional conductors may be arranged e.g. between the bonding layer and the second carrier layer in order to increase the conductivity in the plane of the structure.

The active surfaces are electrically conductive surfaces, conductors, and are preferably coated, printed or laminated on at least one carrier layer. However, if the carrier layers are electrically conductive, no extra active surfaces are needed. The active surfaces may be composed of any electrically conductive material, e.g. copper, aluminium or graphite. The active surfaces may for example be in the form of a metal ink.

The carrier layer represent surfaces that are to be delaminated by the electrical force and can be of any conductive or non-conductive material, e.g. paper, paper board, glass, metal, wood, moulded fibres or plastic. Two opposite sides of an opening of a package may for example represent a first and a second carrier layer. This will be discussed in more detail below.

In accordance with one embodiment, the carrier layers are formed of carton boards and the active layers are formed of an aluminium foil with oxide. The active surfaces are moisturized with a salt solution and bonded together using a composition comprising polyurethane. When a voltage is applied over the laminate structure, the aluminium oxide on the positively charged foil dissolves whereby the laminate is broken. The electrical force may be applied by any of the methods referred to above and in FIG. 1a-c.

The delaminating of the structure can be made easier with a built-in strain in the structure. For example, a rubber ring can be used to form an elastic strain. The electrically weakable adhesive can be applied around the rubber ring and the rubber ring can be pressed together when curing. This can for example be used in order to create "self opening" packages, wherein the product pops up when the user weakens or breaks the bonds in the adhesive by the application of a voltage.

The delaminating material structure comprising carrier layers, active surfaces and an electrically weakable adhesive as described above may be used whenever the strength of a seal needs to be released, for example in the construction of packages. By providing the material structure as described above, the packages may be opened by the application of a voltage. It can be used in all kinds of packages, such as cans, jars, bottles, cartons and blister packages. It may also be used together with all kinds of materials, such as paper, paper board, glass, metal, wood, moulded fibres or plastic. Two opposite sides of an opening of a package may represent a first and second carrier layer and the electrically weakable adhesive described above may be arranged between the carrier layers.

Furthermore, the controlled delaminating material may be used for collation of products in transit or handling and subsequent separation of the products, for separating packages bonded together and for tamper-proofing goods. It may also be used to limit or change the properties of a product before it is purchased in order to prevent theft. Collation of products, tamper-proofing a product or preventing theft of a product may be done by binding existing parts or elements of the product or products together or by binding additional elements to the product or products, using the controlled delaminating material.

FIG. 6-14 discloses examples of uses and applications in different kind of packages.

Figure 6A:
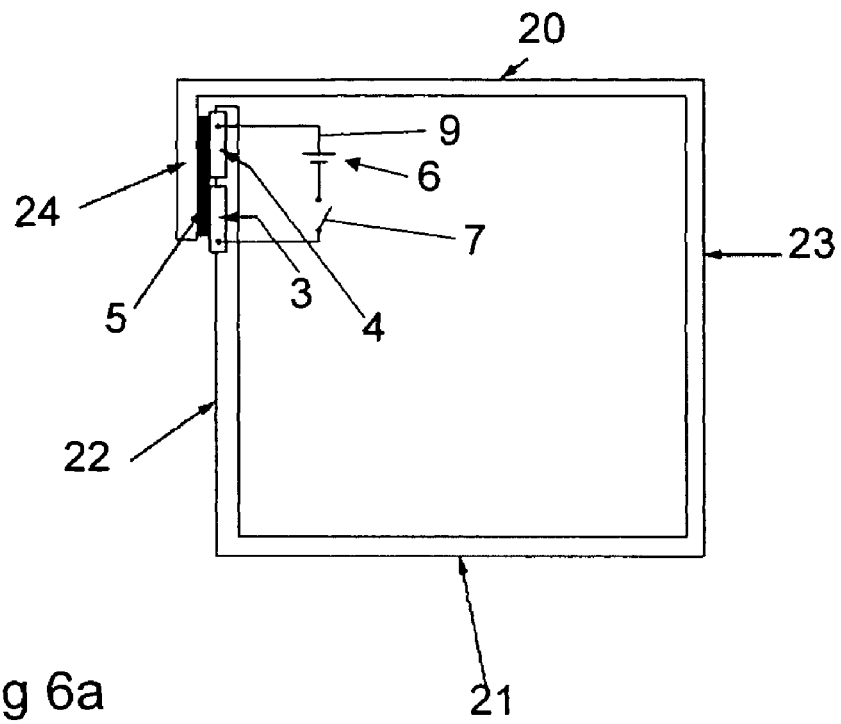
FIG. 6*a* shows in cross-section a package.
Figure 6B:
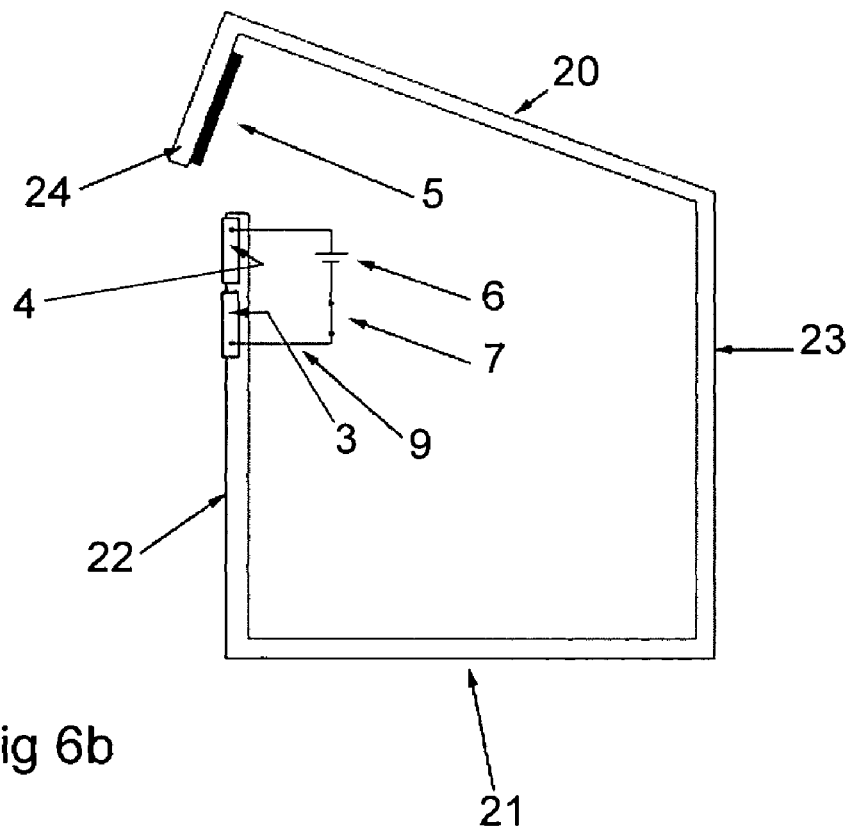
FIG. 6*b* shows in cross-section the package of FIG. 6*a* when opened.

FIG. 6a-b discloses in cross-section a package provided with a closure adapted to be opened using the electrically weakable laminated structure described above.

The package comprises a top panel 20, a bottom panel 21, a front panel 22, a back panel 23 and two side panels (in front of and behind the cross-section of FIG. 6a-b). A closure flap 24 is connected to or integrally formed with the top panel 20. The closure flap 24 is folded relative to the top panel 20, extends along a portion of the front panel 22 and is fastened to the front panel 22 using the electrically weakable laminated structure described above.

Two active surfaces 3, 4 are arranged side by side, but not in direct contact, on one side of the opening closed by the top panel 20. The active surfaces 3, 4 are arranged on the outside of the front panel 22 facing the closure flap 24. A bonding layer 5 is applied between the active surfaces 3, 4 and the closure flap 24, thereby bonding the active surfaces 3, 4 to the closure flap 24. An electrical circuit 9 is provided to electrically connect the active surfaces 3, 4. The circuit is schematically drawn to include a switch 7 and a voltage supply 6. This has been discussed in more detail with reference to FIG. 1a-c.

In FIG. 6a, the switch 7 is open, no current flows through the bonding layer 5 and the closure flap 24 remains bonded to the active surfaces 3, 4 and, consequently, to the front panel 22. In FIG. 6b, the switch 7 is closed, a closed circuit is formed, current flows through the bonding layer 5, thereby causing bonds in the bonding layer 5 or between the bonding layer 5 and one or both of the active surfaces 3, 4 to break or to weaken, whereby the package may easily be opened.

FIG. 6 is a schematic picture showing the principle. Although not shown in FIG. 6, the circuit 9 and the switch 7 may be arranged such that the user that wants to open the package presses a button arranged on the outside of the package, which causes the switch to close and the bonds in the bonding layer to break or to weaken. In an alternative embodiment to the one shown in FIG. 6, the circuit can comprise several switches, such as two switches, so that the user who wants to open the package has to press two buttons, simultaneously or in sequence, in order to be able to open the package. The energy needed to break or weaken the bonds in the bonding layer may e.g. be applied by any of the methods described above and in FIG. 1a-c. Furthermore, insulating layers may be arranged in order to separate the active surfaces 3, 4 out of the plane as described above with reference to FIG. 2-5 and a conventional non-conducting adhesive may be arranged between the bonding layer 5 and the closure flap 24. It may also be noted that, in contrast to FIG. 6 where the front panel 22 constitutes the first carrier layer 1 and the closure flap 24 constitutes the second carrier layer 2, the closure flap 24 may constitute the first carrier layer 1 and the front panel 22 of the package may constitute the second carrier layer 2.

Figure 7:
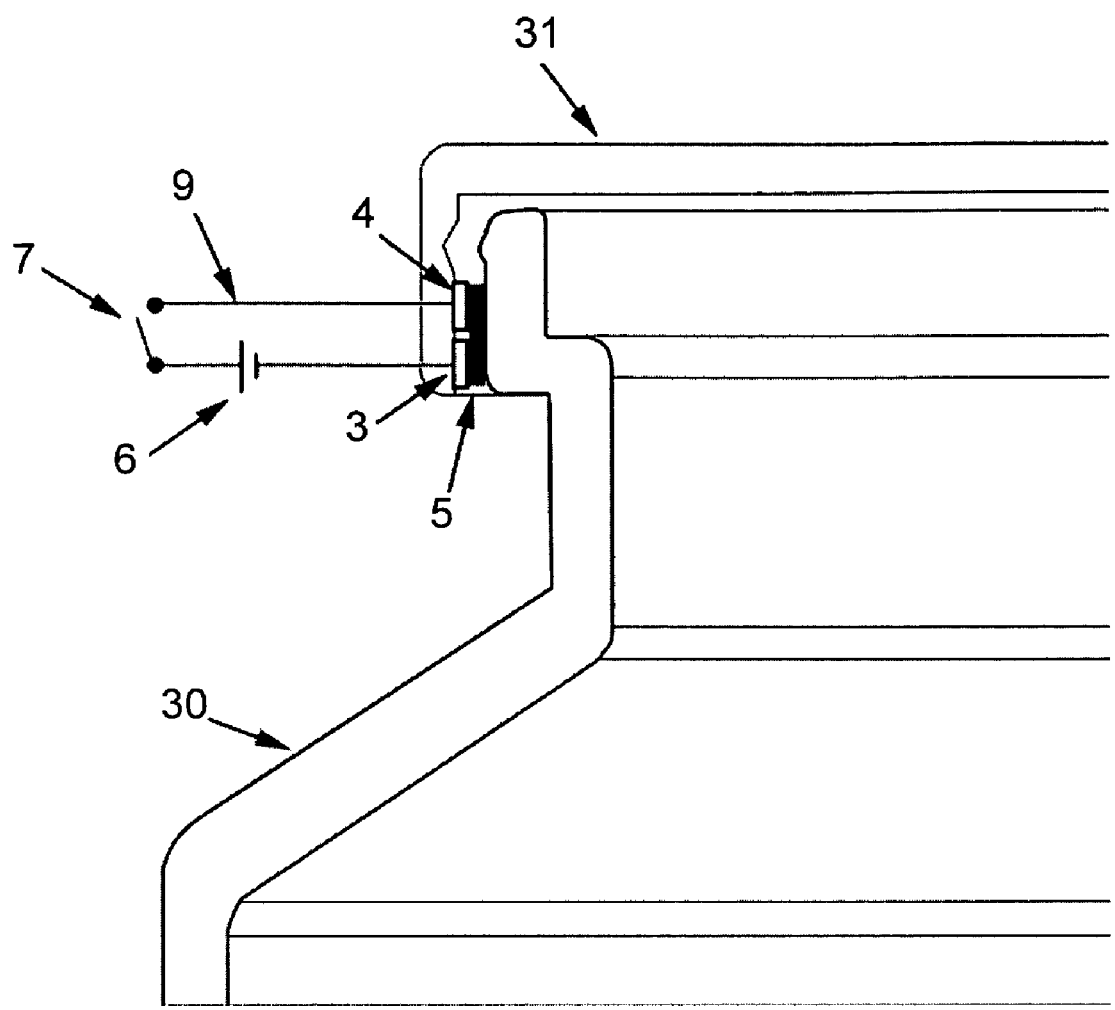
FIG. 7 shows a portion of a bottle neck provided with a screw cap.

FIG. 7 shows another embodiment of a package adapted to be opened by the application of an electrical force, which package comprises two parts, a container 30, which is adapted to receive a product, and a cap 31. The package may for example be a bottle, but any kind of package is possible. The active surfaces 3, 4 are arranged at a distance from each other on the surface of the cap 31 facing the container 30. A bonding layer 5 is applied between the active surfaces 3, 4 and the surface of the container 30 facing the cap 31. The bonding layer 5 glues the cap 31 to the container 30. The active layers 3, 4 are connected by a circuit 9 comprising a switch 7 and a voltage supply 6. When the switch 7 is open, no current flows between the active surfaces 3, 4 or through the bonding layer 5 and the cap remains glued to the container 30. When the switch 7 is closed and current flows through the bonding layer 5, the bonds in the bonding layer 5 or between the bonding layer 5 and one or both of the active surfaces 3, 4 are broken or weakened, whereby the container 30 may easily be opened.

The energy needed to break or weaken the bonds in the bonding layer may, e.g., be applied by any of the methods described above and in FIG. 1a-c. Furthermore, insulating layers may be arranged in order to separate the active surfaces 3, 4 out of the plane as described above with reference to FIG. 2-5 and a conventional non-conducting adhesive may be arranged between the bonding layer 5 and the container 30 or the cap 31. It may also be noted that, in contrast to FIG. 7 where the cap 31 constitutes the first carrier layer 1 and the container 30 constitutes the second carrier layer 2, the container 30 may constitute the first carrier layer 1 and the cap 31 may constitute the second carrier layer 2.

The inner envelope surface of the cap 31 and the outer envelope surface of the neck of the container 30 may be threaded, whereby the cap is screwed on the container. The threads may extend about the complete circumference of the neck or only partly as in a bayonet connection often used in glass jars and metal lids. In such an embodiment the controlled delaminating material may serve as a tamper proof or as a easily breakable sealing layer.

In FIG. 8a-b and FIG. 9, a bottle 80 is provided with a foil 84 fastened to the bottle mouth 83 using a bonding layer 85 of an electrically weakable adhesive. The mouth of the bottle is provided with a surface layer 83 acting as a first active surface. The foil is formed of a conductive material acting as the second active surface 84. The foil if further provided with a flap portion 87a adapted to be folded downward along the bottle neck and to thereby contact an electric circuitry also connected to the first active layer. Thus, when the user would like remove the foil he/she pushes the flap portion 87a into contact with the electric circuitry of the bottle. The electric circuitry may be connected to a battery or the active surfaces may be formed of materials with different electrode potentials, thereby forming an internal battery by themselves. After the electrically weakable adhesive has been weakened, the foil is easily removed as shown in FIG. 9.

In FIG. 10a-b, FIG. 11 and FIG. 12, the can 90 comprises a cylinder wall 90a which is arranged around a centre axis. The can is closed at one end of the cylinder and is at the other end provided with a lid 90b. The lid is connected to the can using an electrically weakable adhesive. The can cylinder is provided with a flange 91 facing the centre of the can. The lid 90b is placed on top of said flange 91. The flange 91 acts as or is provided with a first active surface 93 whereas the lid 90b acts as or is provided with a second active surface 95. Between the active surfaces 93, 95 is a bonding layer 94 of an electrically weakable adhesive arranged. The active surfaces may be connected to a voltage source or be provided by materials having different electrode potentials as discussed in detail above. The active surfaces and the bonding layer form a laminate structure where the layers are arranged in consecutive order; a first active layer, a bonding layer, a second active layer.

The electrical connection may be manoeuvred using a flap 96 extending slightly outside the perimeter of the can 90. This flap 96 may e.g. act as a switch being connected to the active surface 95 of the lid 90b and by folding it along the envelope surface it may come into contact with the active surface 93 of the can cylinder 90a.

In FIG. 13a-b a bag-in-box package is disclosed. The package comprises a relative stiff box 100a usually formed of paper board and a bag 100b usually formed of flexible plastic arranged inside the box 100a. The package in FIG. 13a-b is closed using an electrically weakable adhesive arranged between two active surfaces 103 and 104. The active surfaces is connected to electric circuitry 107a and 107b by which a closed circuit may be formed for application of a potential difference across the bonding layer arranged between the active surfaces 103 and 104. As shown in the enlargement of FIG. 13a, the electrical circuitry 107a is formed of a conductor on a flap connected to one of the active surfaces 104 and a connector portion on the outside of the box 100a. The circuitry may also comprise a battery. As discussed in detail above, there are other means to provide the voltage, such as by forming the active surfaces of materials with different electrode potentials, thereby forming an internal battery themselves.

FIG. 14a-b shows a package basically of the kind shown in FIG. 6a-b. The package of FIG. 14a-b is further provided with an additional compartment 110b. In this specific embodiment the additional compartment 110b is arranged inside the main compartment 110a. The compartments may however be arranged side by side where none of them encloses the other. The additional compartment 110b is provided with an opening formed of a first active surface 113 and a second active surface 114 held together by a bonding layer comprising an electrically weakable adhesive. The package is further provided with electrical circuitry adapted to provide electrical potential difference between the active surfaces 113 and 114. The electrical circuitry comprises a switch by which the electrical circuitry may be closed to form a closed circuit. When the user activates the switch, the bond between the active layers 113 and 114 is broken such that the product inside the additional compartment 110b is introduced into the main compartment 110a. This may, e.g., be suitable to use when a product in the additional compartment 110b will react with the product in the main compartment 110a. This may, e.g., be the case with yeast or bacterial cultures that are to be added to food products or the like. In such a case the additional compartment may be opened first, the package is thereafter shaken to mix the product with the yeast, where after the main compartment is opened and the mixed product is emptied out of the package.

Alternatively, the compartments may be arranged side by side such that they all open directly out of the package. This may, e.g., be the case where two food products are served in a ready to eat meal, where the intention is that one of the products is to be poured on top of the other, such as jam onto rice pudding or muesli into soured milk.

It may also be noted that although the packages described above are packages forming one or more closed compartments, the inventive package may also be more or less open packages. The inventive package may e.g. be a sling that are adapted to be wound about a ream paper sheets.

It may also be noted that the package may be used as a not only as a primary package containing a product, but also as so-called secondary packages containing or enveloping primary packages. A secondary package may in turn be contained in another secondary package.

The invention claimed is:

1. A package comprising,
   a container;
   a closure member adapted to close said container;
   a first electrically conductive active surface on one of said container and said closure member;
   a second electrically conductive active surface on one of said container and said closure member, said second active surface being spaced a distance from said first active surface when said closure member is positioned to close said container;
   a bonding layer comprising an electrically weakable adhesive bridging the distance between said first active surface and said second active surface, and adhering said closure member to said container to close the package;
   electrical current supply means; and
   an electric circuit for supplying electrical current from said supply means to said active surfaces and thereby to said electrically weakable adhesive to weaken the adhesive to open the package.

2. A package as in claim 1, wherein said electrical current supply means comprises at least one battery, and wherein said circuit comprises a switch for selectively connecting said battery to said active surfaces.

3. A package as in claim 1, wherein said electrical current supply means comprises a difference in electrical potential between said first active surface and said second active surface, without an external power supply, and wherein said circuit comprises a switch for selectively connecting said first and second active surfaces.

4. A package as in claim 3, wherein said switch comprises a metal foil flap extending from said closure member.

5. A package as in claim 1, wherein said electrical current supply means comprises an electromagnetic wave source, and said circuit comprises an electromagnetic wave receptor.

6. A package as in claim 1, wherein said first active surface is on one of said container and said closure member, and said second active surface is on the other of said container and said closure member.

7. A package as in claim 1, wherein said first active surface and said second active surface are both on one of said container and said closure member and are both on one side of said bonding layer.

8. A package comprising,
a first package portion having first and second active surfaces being electrically conducting and being arranged at a distance from each other;
an electrical circuit on the package configured to electrically connect said first and second active surfaces;
a second package portion; and
a bonding layer comprising a weakable adhesive bridging the distance between said first and second active surfaces and at least partially adhering said first package portion and said second package portion, said first and second active surfaces being on one side of said bonding layer and said second package portion being on the other side of said bonding layer.

9. A package as in claim 8, wherein said first and second active surfaces are in the same plane on said first package portion.

10. A package as in claim 9 wherein said second active surface substantially surrounds said first active surface.

11. A package as in claim 8, further comprising an insulating material layer laminated between said first and second active surfaces, said first and second active surfaces being stacked in different layers and separated by said insulating layer.

12. A package as in claim 8 wherein said bonding layer further comprises an non-electrically weakable adhesive between said electrically weakable adhesive and said second package portion.

13. A package according to claim 8, wherein said electrically weakable adhesive forms a sealing layer that seals the package closed.

14. A package according to claim 8, wherein at least one of the package portions is formed of a non-conductive material.

15. A package according to claim 8, wherein said electrical circuit comprises a source of electrical power on the package.

16. A package according to claim 15, wherein the first active surface is comprised of a first material with a first electrode potential, and the second active surface is comprised of a second material with a second electrode potential, and wherein the first electrode potential differs from the second electrode potential, the difference in electrical potential comprising said source of electrical power.

17. A package according to claim 15, wherein said source of electrical power comprises at least one battery.

18. A package according to claim 8 wherein said electrically weakable adhesive covers at least a portion of said first and second active surfaces and is adhered to said first package portion in between said first and second active surfaces.

19. A method of making a package, comprising
providing first and second package portions adapted to be connected to each other to keep the package closed,
applying a first electrically conductive active layer to one of the package portions,
applying a second electrically conductive active layer to one of the package portions spaced a distance apart from the first active layer when the package is closed,
applying a power source to the package,
applying an electrical circuit to the package for selectively connecting the power source to the first and second active layers, and
applying an electrically weakable adhesive to and bridging between the first and second active layers and in between the first and second package portions to seal the package closed.

20. A method as in claim 19 wherein the steps of applying the first and second active layers comprises simultaneously printing one of the package portions with conductive material, the first and second active layers being in the same plane.

21. A method as in claim 19 further comprising the step of applying an insulating layer in between the steps of applying the first and second active layers, the first active layer, insulating layer, and second active layers forming a laminate structure on one of the package portions.

22. A method as in claim 19 wherein the step of applying a power source to the package comprises laminating at least one battery to one of the package portions.

23. A method of making a package, comprising
providing a container, the container having an electrically conductive sealing area,
providing a lid comprised of a metal foil, the lid being adapted to close the container,
sealing the lid to the container with an electrically weakable adhesive, the lid metal foil being out of contact with the electrically conductive sealing area.

24. A method as in claim 23, wherein the lid comprises a flap that extends beyond sealing area of the container, the flap being adapted to folded to electrically connect the foil metal lid to the electrically conductive sealing area of the container.

25. A package comprising,
a container;
a closure member adapted to close said container;
a first electrically conductive active surface on one of said container and said closure member;
a second electrically conductive active surface on one of said container and said closure member, said second active surface being spaced a distance from said first active surface when said closure member is positioned to close said container;
a bonding layer comprising an electrically weakable adhesive bridging the distance between said first active surface and said second active surface, and adhering said closure member to said container to close the package;
electrical current supply means;
an electric circuit for supplying electrical current from said supply means to said active surfaces and thereby to said electrically weakable adhesive to weaken the adhesive to open the package; and
a switch for selectively supplying said electrical current to said active surfaces.

* * * * *